United States Patent [19]
Ciardella et al.

[11] Patent Number: 5,505,777
[45] Date of Patent: Apr. 9, 1996

[54] COMPUTER CONTROLLED VISCOUS FLUID DISPENSING SYSTEM

[75] Inventors: Robert L. Ciardella, Encinitas; Philip P. Maiorca, Poway; Alec J. Babiarz, Encinitas; Duong La, San Diego; Carlos E. Bouras, Encinitas; Mark S. Meier, Encinitas; John L. Christofferson, Encinitas; Ronald N. Abernathy, Vista; Stanley C. Aguilar, La Mesa; James C. Smith, San Marcos, all of Calif.

[73] Assignee: Asymptotic Technologies, Inc., Carlsbad, Calif.

[21] Appl. No.: 192,709

[22] Filed: Feb. 7, 1994

Related U.S. Application Data

[63] Continuation-in-part of Ser. No. 978,783, Nov. 19, 1992, Pat. No. 5,320,250.

[51] Int. Cl.$^6$ ............................. B05C 5/00; B05C 11/00; B05B 15/00; B05B 1/02
[52] U.S. Cl. .................. 118/663; 118/679; 118/697; 118/712; 118/302; 118/323; 348/87; 364/269; 364/DIG. 1; 382/145; 222/61; 222/196; 222/420; 239/102.1; 239/227; 239/751
[58] Field of Search ...................... 118/323, 324, 118/679, 712, 713, 302, 663, 696, 697, 698; 348/87, 88, 135; 364/269, DIG. 1; 382/8, 145, 141; 222/61, 154, 196, 420; 239/71, 102.1, 751, 227

[56] References Cited

U.S. PATENT DOCUMENTS

| | | | |
|---|---|---|---|
| 2,880,764 | 4/1959 | Pelavin . | |
| 2,898,860 | 8/1959 | Gröber . | |
| 3,646,521 | 2/1972 | Porter | 118/679 |
| 3,851,801 | 12/1974 | Roth | 222/146 |
| 3,950,761 | 4/1976 | Kashio | 346/140 R |
| 4,030,640 | 6/1977 | Citrin et al. | 222/207 |
| 4,294,381 | 10/1981 | Miller | 222/1 |
| 4,295,198 | 10/1981 | Copeland et al. | 348/87 |
| 4,419,384 | 12/1983 | Kane et al. | 118/679 |
| 4,421,800 | 12/1983 | Schoenberg et al. | 118/679 |
| 4,448,821 | 5/1984 | Busshor | 118/679 |
| 4,550,325 | 10/1985 | Viola | 346/140 |
| 4,564,410 | 1/1986 | Clitheros et al. | 118/323 |
| 4,584,964 | 4/1986 | Engel | 118/679 |
| 4,661,368 | 12/1987 | Rohde | 427/8 |
| 4,692,351 | 9/1987 | Maeda et al. | 118/697 |
| 4,710,399 | 12/1987 | Dennis | 437/245 |
| 4,711,379 | 12/1987 | Price | 222/504 |
| 4,725,884 | 2/1988 | Gurnell et al. | 348/87 |
| 4,762,578 | 8/1988 | Burgin | 156/64 |
| 4,919,074 | 4/1990 | Kurihara et al. | 118/323 |
| 4,935,261 | 7/1990 | Srivastava et al. | 427/10 |
| 4,941,428 | 7/1990 | Engel | 118/697 |
| 4,967,933 | 11/1990 | Maiorca et al. | 118/697 |

(List continued on next page.)

*Primary Examiner*—David L. Lacey
*Assistant Examiner*—Steven P. Griffin
*Attorney, Agent, or Firm*—Baker, Maxham, Jester & Meador

[57] ABSTRACT

A computer controlled system for high speed surface mount adhesive placement in circuit board production includes a dot generator supported for motion along the X, Y and Z axes. The dot generator ejects a jet of viscous adhesive that breaks away from the nozzle of the dot generator as a result of its own forward momentum. The system includes an automatic circuit board conveyor with adjustable width and pneumatically operated lift and lock mechanisms. The system runs through a self-diagnostic set-up procedure and dot calibration routine. Dot size and location are monitored through a video camera and vision circuit. A computer interfaces with the vision circuit and with motion, dot generator and conveyor controllers so that the system can operate in a high volume production assembly line. Application programs are executed by the system computer typically utilizing CAD data from a disk or a computer integrated manufacturing (CIM) controller. The system automatically assigns dot sizes to specific components based on user specifications or a component library. Dot placement paths are optimized by aligning the in-line points.

8 Claims, 4 Drawing Sheets

U.S. PATENT DOCUMENTS

| | | | |
|---|---|---|---|
| 4,974,754 | 12/1990 | Wirz | 222/207 |
| 5,022,556 | 6/1991 | Dency et al. | 118/698 |
| 5,052,388 | 10/1991 | Maiorca et al. | 118/668 |
| 5,108,024 | 4/1992 | Kazem-Goudarzi et al. | 118/713 |
| 5,110,615 | 5/1992 | Maiorca et al. | 427/8 |
| 5,134,665 | 7/1992 | Jyoko | 348/87 |
| 5,154,319 | 10/1992 | Deininger et al. | 222/105 |
| 5,186,982 | 2/1993 | Blette et al. | 118/697 |
| 5,195,656 | 3/1993 | Briehl et al. | 222/1 |
| 5,234,134 | 8/1993 | Raab et al. | 222/321 |
| 5,324,359 | 6/1994 | Cleveland et al. | 118/323 |

COMPUTER CONTROLLED VISCOUS FLUID DISPENSING SYSTEM

CROSS-REFERENCE TO RELATED APPLICATION

The present invention is a continuation-in-part of allowed U.S. patent application Ser. Number 07/978,783 filed on Nov. 19, 1992, issued on Jun. 14, 1994 as U.S. Pat. No. 5,320,250, and entitled METHOD FOR RAPID DISPENSING OF MINUTE QUANTITIES OF VISCOUS MATERIALS.

BACKGROUND OF THE INVENTION

The present invention relates to equipment for assembly line production of electronic circuit boards, and more particularly, to a computer controlled system for high speed surface mount adhesive placement in circuit board production.

The dispensing of adhesives quickly and reliably in the manufacture of circuit boards on which components are surface mounted is a difficult task. There are inherent speed limitations associated with rotary positive displacement valves, pneumatically actuated syringes and mechanically actuated pinch tubes used in conventional viscous material dispensers. Warped boards, air in the syringe, and stringing of the surface mount adhesive cause inconsistent dispensing and create the need for inspection and rework. As a result, the adhesive dispenser often becomes the bottleneck in the pick-and-place line.

Suppliers in the fluid dispensing industry have been able to make steady incremental improvements in dispensing speed over the past several years to achieve eights dots per second. However, inconsistencies and the need for inspection and rework were not adequately addressed until ASYMTEK of Carlsbad, California developed the DispenseJet (Trademark) apparatus disclosed in allowed U.S. patent application Ser. No. 07/978,783 filed Nov. 19, 1992, issued on Jun. 14, 1994 as U.S. Pat. No. 5,320,250, and entitled METHOD FOR RAPID DISPENSING OF MINUTE QUANTITIES OF VISCOUS MATERIALS. The DispenseJet apparatus uses a nozzle and syringe in combination with a feed tube. The nozzle is impacted by a solenoid actuated hammer to rapidly reduce the volume of a dot generation chamber formed between the nozzle and the feed tube. This causes a jet of viscous material to be ejected from the nozzle and to break away from the nozzle as a result of its own forward momentum. With this new system, it is possible to dispense 72,000 dots per hour from a single head "on the fly" as it passes laterally over a PC board. Adhesive stringing is eliminated with this approach because it does not require wetting of the workpiece surface as is the case with traditional syringe dispenser. The dots generated by the DispenseJet apparatus have a consistent size regardless of height variations in the board due to warpage.

The aforementioned patent application disclosing the DispenseJet apparatus does not disclose the manner in which the apparatus can be supported on a frame and provided with automatic controls for optimum usage in a high volume assembly line.

SUMMARY OF THE INVENTION

It is therefore the primary object of the present invention to provide a computer controlled system for rapidly forming dots of viscous material without wetting for utilization in high volume assembly line production of surface mount circuit boards.

According to the preferred embodiment of our invention, a computer controlled system for high speed surface mount adhesive placement in circuit board production includes a dot generator supported for motion along the X, Y and Z axes. The dot generator ejects a jet of viscous adhesive that breaks away from the nozzle of the dot generator as a result of its own forward momentum. The system includes an automatic circuit board conveyor with adjustable width and pneumatically operated lift and lock mechanisms. The system runs through a self-diagnostic set-up procedure and dot calibration routine. Dot size and location are monitored through a video camera and vision circuit. A computer interfaces with the vision circuit and with motion, dot generator and conveyor controllers so that the system can operate in a high volume production assembly line. Application programs are executed by the system computer typically utilizing CAD data from a disk or a computer integrated manufacturing (CIM) controller. The system automatically assigns dot sizes to specific components based on user specifications or a component library. Dot placement paths are optimized by aligning the in-line points.

DETAILED DESCRIPTION OF THE PREFERRED EMBODIMENT

The entire disclosure of U.S. patent application Ser. No. 07/978,783 filed Nov. 19, 1992, issued on Jun. 14, 1994 as U.S. Pat. No. 5,320,250, and entitled METHOD FOR RAPID DISPENSING OF MINUTE QUANTITIES OF VISCOUS MATERIALS is specifically incorporated herein by reference.

Figure 1:
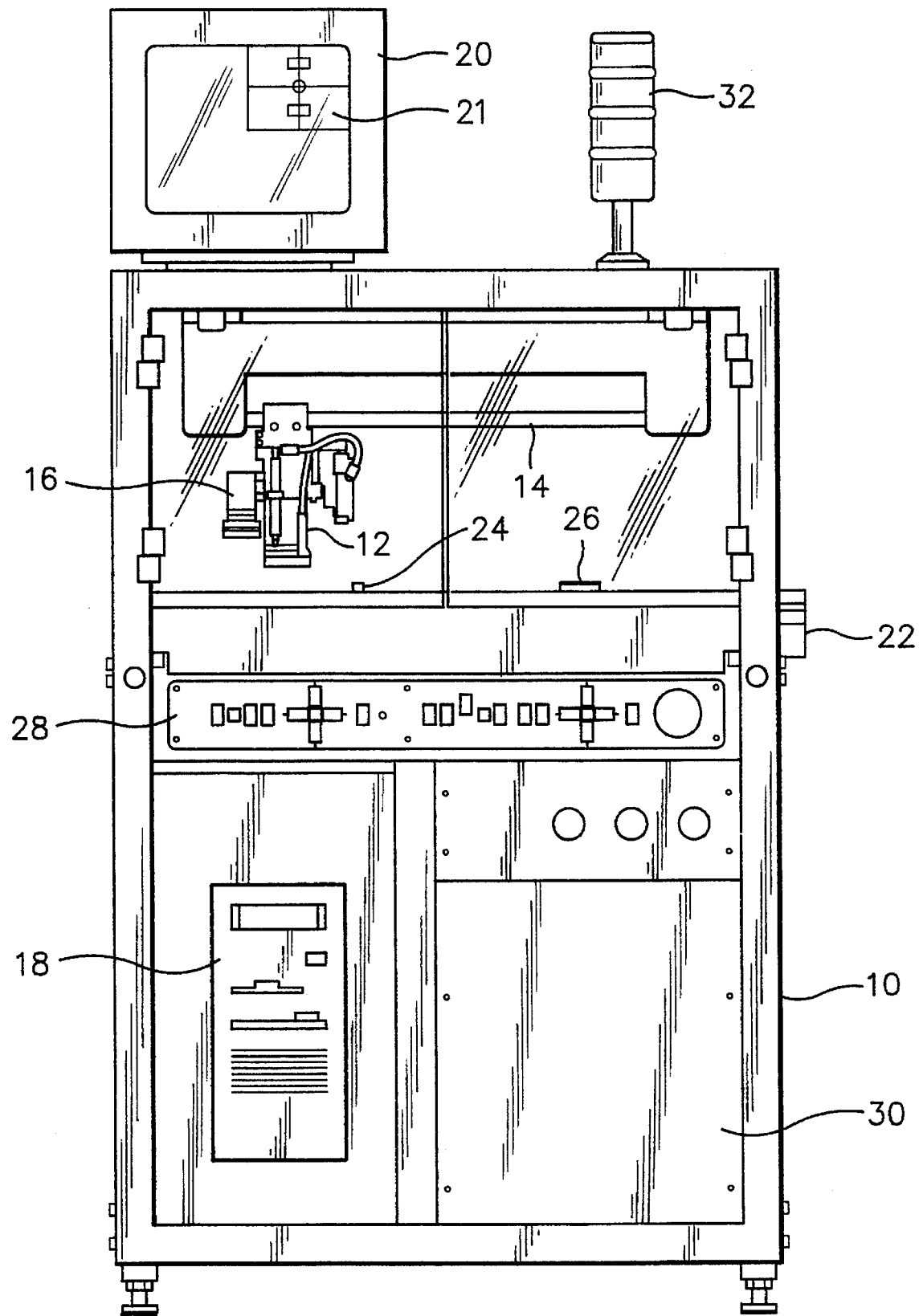
FIG. 1 is a side elevation view of a preferred embodiment of our system.

Referring to FIG. 1, our system includes a rectangular frame 10 made of interconnected horizontal and vertical steel beams. A viscous material dot generator 12 is suspended from an X-Y positioner 14 mounted to the underside of the top beams of the frame 10. The X-Y positioner 14 includes a cable drive coupled to pair of stepper motors which are independently controlled as more fully described in U.S. Pat. No. 4,967,933 entitled METHOD AND APPARATUS FOR DISPENSING VISCOUS MATERIALS, the entire disclosure of which is incorporated herein by reference. The dot generator 12 is connected to the X-Y positioner by a Z-axis drive mechanism (not illustrated) of the same general type as disclosed in the aforementioned U.S. Pat. No. 4,967,933. A video camera and LED light ring assembly 16 are connected to the dot generator 12 for motion along the X, Y and Z axes to inspect dots and locate reference fiducial points. The video camera and light ring assembly 16 may be of the type described in U.S. Pat. No. 5,052,338 entitled APPARATUS FOR DISPENSING VISCOUS MATERIALS A CONSTANT HEIGHT ABOVE A WORKPIECE SURFACE, the entire disclosure of which is incorporated herein by reference.

A computer 18 is mounted in the lower portion of the frame 10 for providing the overall control for the system. By way of example, the computer 18 may comprise an IBM VALUE POINT 486 DX/T personal computer. A color video monitor 20 sits on top of the frame 10 and is connected to the computer 18. A user interfaces with the computer 18 via a keyboard (not shown). A video frame grabber in the computer software causes a real time magnified image 21 of a cross-hair and dispensed dot to be displayed in a window on the monitor 20, surrounded by the text of the control software.

Circuit boards which are to have dots of adhesive rapidly applied thereto by the dot generator 12 are horizontally transported through the frame 10 directly beneath the dot generator 12 by an automatic conveyor 22. The conveyor 22 is of conventional design and has a width which can be adjusted upon command to accept circuit boards of different dimensions. The conveyor 22 also includes pneumatically operated lift and lock mechanisms.

The preferred embodiment of our system further includes a nozzle priming station 24 and a nozzle calibration set-up station 26. A control panel 28 is mounted in the middle of the frame 10, just below the level of the conveyor 22. It includes a plurality of push buttons for manual initiation of certain functions during set-up, calibration and viscous material loading.

A hinged door 30 connected to the frame 10 is openable to permit access to a large housing adjacent the computer 18. This housing encloses a plurality of removable modules containing the electrical circuitry, pneumatic circuitry and switching required to perform the functions hereinafter described in detail.

A machine status beacon 32 is connected to the top of the frame 10. It includes green, yellow, red and blue lights which may be illuminated under command of the computer 18 to draw the attention of an assembly line worker. The red light is illuminated if system operation is suspended. The blue light is illuminated to indicate low adhesive level. The green and yellow lights are illuminated to indicate automatic and pass-through modes of operation, respectively. A ferrous ring is placed on top of the adhesive in the syringe. The height of the ring is inductively sensed to monitor the level of the remaining adhesive. A capacitive sensing arrangement could be used as an alternative with a dielectric material replacing the ferrous ring.

Figure 2:
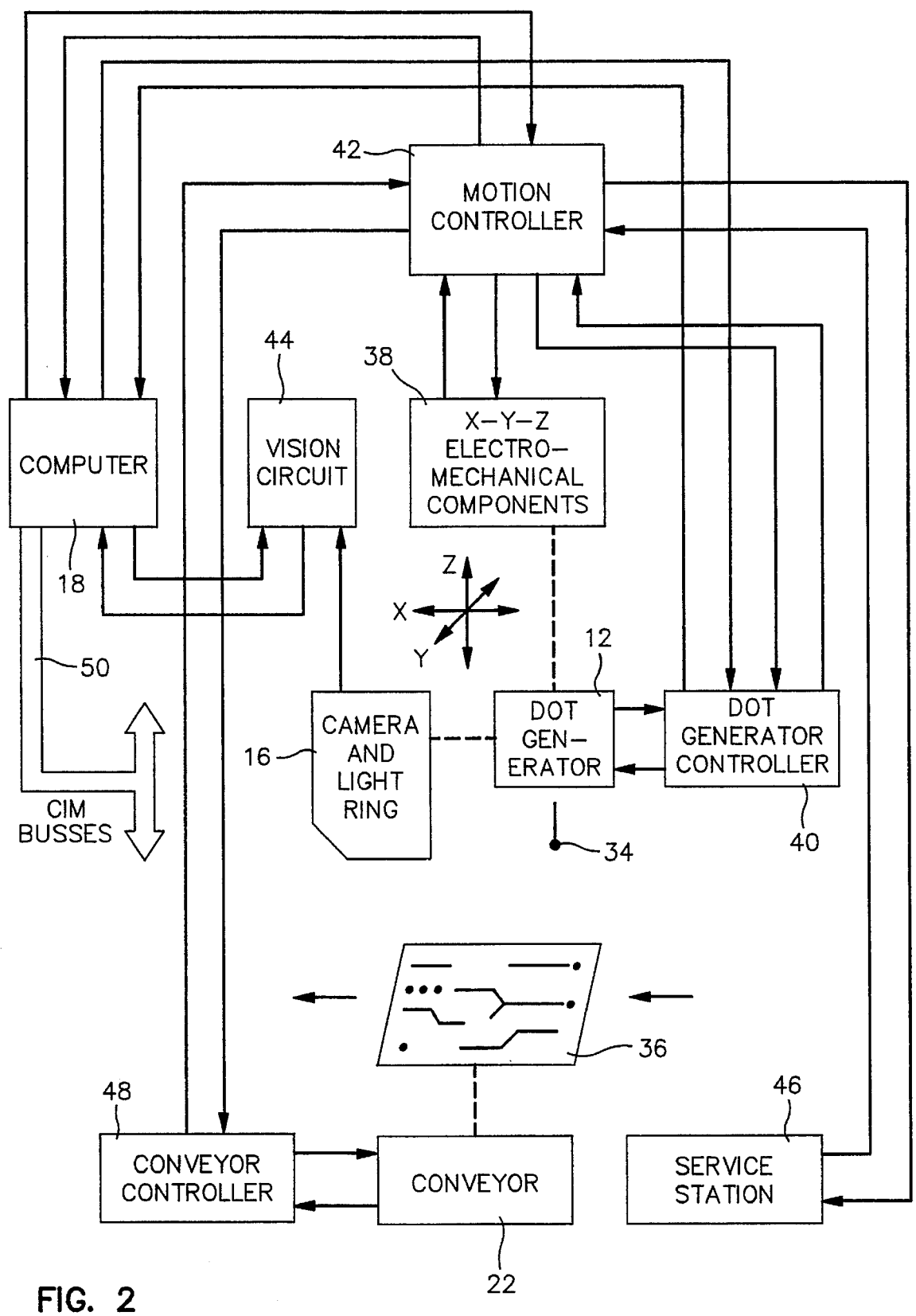
FIG. 2 is a block diagram of the preferred embodiment of our system.

Referring to FIG. 2, the dot generator 12 is shown in block diagram form ejecting a jet 34 of viscous material downwardly onto the upper surface of a circuit board 36. The circuit board 36 is of the type designed to have components surface mounted thereon utilizing minute drops of adhesive accurately placed at predetermined locations. The adhesive dots are placed rapidly and consistently utilizing the DispenseJet apparatus of the aforementioned U.S. patent application Ser. No. 07/978,783. The circuit board is laterally moved into a fixed position by the conveyor 22 as indicated by the horizontal arrows in FIG. 2. The X-Y-Z electro-mechanical components 38 of the system rapidly move the dot generator 12 over the surface of the circuit board 36. The X-Y-Z electro-mechanical components 38 include the X-Y positioner 14 and the Z-axis drive mechanism previously described. Usually the dot generator 12 ejects adhesive from one fixed Z height. However, the dot generator 12 can be raised during operation to dispense at other Z heights or to clear other components already mounted on the board. The dispense cycle begins with a software command to fire a solenoid in the dot generator. The solenoid produces a rapid volume displacement which causes the jet 34 of adhesive to be rapidly ejected from the nozzle. The jet breaks away as a result of its own forward momentum and forms into a dot on the upper surface of the circuit board 36.

The dot generator 12 includes heater elements and heat sensing elements which are used to control the viscosity of the adhesive. The dot generator also includes a strain gauge. A dot generator controller 40 includes a heater regulator circuit with a feedback loop for precisely controlling the temperature of the adhesive. The dot generator controller 40 also has a closed loop circuit that includes the strain gauge. The dot generator controller 40 commands an air valve to apply pressure to the adhesive containing syringe. The signal from the strain gauge is utilized to precisely control nozzle refill and to indicate when the dot generator is ready for the next shot.

Adhesive placement by the dot generator 12 is very precise and consistent. The dot diameter is tightly controlled with a closed loop feedback system and by a motor which controls the stroke of the nozzle displacement. The resolution of the stroke control is preferably 0.0025 millimeters (0.0001 inches). The process of shooting a dot is accomplished in one millisecond. Because of the velocity of the jet 34 of viscous adhesive is hundreds of times faster than the motion of the dot generator 12 along the X and Y axes, the dot generator 12 does not have to stop at each dot location to place the dot. In other words, our system dramatically improves dispensing speed by moving over the circuit board and shooting the dots onto its surface "on-the-fly".

The motion of the dot generator 12 and the camera and light ring assembly 16 connected thereto, are governed by a motion controller 42. The motion controller 42 includes separate drive circuits for the X,Y and Z axis motors. These drive circuits have analog outputs and digital inputs which are received from the computer 18. Digital-to-analog motor controllers of this general type are well known and their details need not be further described.

The camera and light ring assembly 16 is connected to a vision circuit 44. This circuit drives the red LEDs of the light ring for illuminating the surface of the circuit board 36 and the dots formed thereon. The video camera of the assembly 16 includes a charge coupled device (CCD) whose output is converted to digital form and processed in determining both the location and size of a selected dot dispensed onto the circuit board 36. The vision circuit 44 interfaces with the computer 18 to provide information thereto in both set-up and run modes.

The nozzle priming station and nozzle set-up station 24 and 26 (FIG. 1) are collectively illustrated as a service station 46 in FIG. 2. A conveyor controller 48 is connected to the circuit board conveyor 22. The conveyor controller 48 interfaces between the motion controller 42 and the conveyor 22 for controlling the width adjustment and lift and lock mechanisms of the conveyor 22. The conveyor controller 48 also controls the entry of the circuit board 36 into the system and the departure therefrom upon completion of the dot deposition.

CAD data from a disk or a computer integrated manufacturing (CIM) controller are utilized by the computer 18 to control the motion of the dot generator 12 through the motion controller 42. This ensures that the minute drops of adhesive are accurately placed on the printed circuit board 36 at predetermined locations. In applications where CAD data is not available, the software utilized by the computer 18 allows for the locations of the dots to be directly programmed. The computer 18 utilizes the X and Y locations, the component types and the component orientations to determine where and how many drops of adhesive to dispense onto the upper surface of the circuit board 36. The computer 18 automatically assigns dot sizes to specific components based on the user specifications or component library. The path for dispensing the minute drops of adhesive is optimized by aligning the in-line points. Our system has a simple set-up process. The first step in the set-up process is to install a nozzle assembly and a full adhesive syringe. The nozzle assembly is preferably of a disposable type designed to eliminate air bubbles in the fluid flow path. One suitable disposable nozzle is disclosed in U.S. patent application Ser. No. 08/187,644, filed Jan. 27, 1994 entitled DISPOSABLE NOZZLE ASSEMBLY FOR HIGH SPEED VISCOUS MATERIAL DROPLET DISPENSER, the entire disclosure of which is incorporated herein by reference. After the installation of the disposable nozzle assembly and the adhesive syringe, the system runs through a self diagnostic set-up program and dot calibration routine to ensure correct operation. The dot generator 12 is first moved to the nozzle priming station 24 (FIG. 1) where the disposable nozzle assembly is mated with a resilient priming boot. Using an air cylinder (not shown) a vacuum is then pulled on the boot to suck adhesive from the syringe, through the disposable nozzle assembly. During this time the syringe of the dot generator 12 is pressurized from the air supply. The dot generator 12 is then moved to the nozzle calibration set-up station 26 and dot calibration is achieved by shooting a test pattern of dots onto a sample substrate and measuring the diameter of the dots using the camera and light ring assembly 16 and vision circuit 44 (FIG. 2). The dispensed dot size is compared with a reference and adjustments are made automatically.

Standard dot sizes accommodate components from 0603s to QFPs. The system is fully programmable for user definable dot sizes in between. When the dot sizes have been calibrated, the system is ready for assembly line operation. The consistent closed loop dot generator 12 delivers high quality dots at very high speed, i.e. 0.05 seconds per dot. This is calculated by using a bench mark test of 0.0635 millimeter (0.025 inch) dots on 2.54 millimeter (0.10 inch) center in a straight line.

The width of the conveyor 22 is automatically adjustable under control of the computer 18 to fit the computer integrated manufacturing (CIM) environment. Once the circuit board 36 has been loaded into the conveyor 22, it is transported to a fixed position, roughly intermediate the length of the frame 10. An automatic fiducial recognition system locates the fiducials in the circuit board and corrects for any misalignment to ensure placement accuracy. The computer 18 is provided with standard RS 232 and SMEMA CIM communications busses 50 which are compatible with most types of other automated equipment utilized in circuit board production assembly lines.

The tightly controlled volume of adhesive is rapidly ejected from the dot generator 12 from a position above the upper surface of the board 36. By way of example, the distance between the surface of the board and the tip of the disposable nozzle of the drop generator 12 may be approximately 3.4 millimeters (0.13 inches). The traditional problems with adhesive stringing and wetting to warped surfaces are eliminated. Examples of adhesive which may be rapidly dispensed with our system are sold under the trademarks LOCTITE, GRACE, and HERAEUS.

Current viscous material droplet dispensers require the user to go through a trial and error process to set up the machine in order to obtain the desired dot size. A trial run is made, the results are observed and measured, and valve parameters are adjusted until the desired dot size is achieved. The software utilized by the computer 18 of our system automates the dot size calibration routine. The computer 18 controls the dot generator 12 through the dot generator controller 40. The computer 18 keeps track of a fluid parameter table in a disk file. This table sets forth the parameters of the latest fluid in use. The user specifies the desired dot sizes via the computer keyboard. Through the automatic dot size calibration software, the computer 18 is capable of commanding a number of preselected dot sizes, for example, five. The computer 18 controls the stroke of the nozzle through the dot generator controller 40. The computer 18 then measures the dot diameter, area and position through the camera and light ring assembly 16 and vision circuit 44. The computer then establishes a curve of dot diameters or areas as a function of stroke length. Using linear extrapolation, the computer can then determine the correct stroke length to produce the predetermined desired dot size. The computer also uses position information to compensate for dot placement accuracy as described hereafter. Each time a new stroke value is computed, the system needs to re-calibrate the nozzle re-fill step in order to establish the correct air ON time.

Because our system ejects viscous material "on-the-fly", the trajectory of the jet of viscous material will effect the position of the dot ultimately formed on the workpiece surface. Accordingly, it is necessary to compensate for the transverse movement of the dot generator 12 relative to the surface of the workpiece 36. The X-Y positioner 14 accelerates and decelerates in a substantially uniform manner. The motion profile generally has an acceleration portion, a constant velocity portion and a deceleration portion. It will be understood that a jet of viscous material is ejected by the dot generator which subsequently forms into a dot on the surface of the workpiece. However, for the sake of simplicity, we shall hereafter refer to the ejection of dots.

The first dot is typically ejected from the dot generator 12 before it has begun to move in either the X or Y directions. Therefore, no compensation is required for the ejection of the first dot. The dots which are subsequently ejected by the dot generator 12 are ejected while the dot generator 12 is moving along either the X, or Y axes, or both. Typically dots are not ejected while the dot generator 12 is being adjusted along the Z axes. Dots are thus ejected while the dot generator 12 is moving in the plane of the workpiece surface. Dots which are ejected from the moving dot generator will carry a horizontal velocity component, similar to that of a bomb dropped by an airplane. The dots need to be fired ahead of the targeted location. The duration of the pre-triggering is a function of the horizontal velocity, the vertical downward velocity and the timing delay of the firing electronics and mechanisms. The last dot ejected is typically ejected after the dot generator 12 has come to a complete stop and therefore no compensation is required to ensure its placement accuracy.

When the system performs a calibration run, dots are first fired without providing any compensation. By measuring and analyzing the landing positions of the first dot, all subsequent dots and the last dot, the system acquires the desirable compensation values needed to pre-trigger the firing. Because the downward velocity of the dots is substantially constant and is much greater than the horizontal velocity component, the dot placement errors are a linear function of the horizontal velocity component. Therefore, since the system knows the velocity during a test run, it can readily compute a compensation factor as a ratio of distance versus velocity. For actual fluid shooting, the compensation is equal to the product of the compensation factor and the actual velocity.

The temperature of the dot generator 12 is maintained at a predetermined level by a heater regulator circuit which is part of the dot generator controller 40. When the system is OFF, the heater element in the dot generator 12 is not energized. When the system is ON and ready to fire dots, the control software run by the computer 18 commands to the dot generator controller 40 to energize the heater element. The system waits for the temperature of the dot generator 12 to stabilize before shooting dots. If the system is idle and not shooting dots, it is not desirable to keep heating the small amount of viscous fluid inside the dot generator 12 for a prolonged period of time. Accordingly, our system includes a programmable time-out timer to turn OFF the heater element in the dot generator 12 if the system has not fired any dots after a predetermined duration. The timer is reset to zero if any dots are fired, to thereby re-initialize another time-out period. Our system includes another timer to keep track of how long the heater element has been OFF in order to provide additional control to the system. If the small amount of viscous fluid inside the dot generation chamber is repeatedly heated, the system will move the dot generator 12 to the nozzle priming station 24 in order to purge the aged fluid and replenish it with fresh fluid.

When the dot generator 12 is commanded to make a dot, its solenoid is immediately supplied with a high voltage signal which causes its hammer to impact the nozzle. This rapidly reduces the volume of the dot generation chamber formed by the nozzle and the feed tube. Upon the nozzle's return, the dot generation chamber that was previously full of viscous material now contains some air that has been sucked in through the nozzle exit orifice as the nozzle returns and comes to rest against the strain gauge sensor. The dot generation chamber now needs to be re-filled with viscous material. The is done by applying air pressure to the syringe or other viscous material reservoir. As the pressurized viscous material flows into the dot generator chamber, its starts to evacuate the air in it. This is done by applying air pressure to the material reservoir. As the pressurized material flows into the nozzle, its starts to evacuate the air in it. As soon as all the air has been evacuated and the viscous material has reached the nozzle exit orifice, the resistance to flow through this orifice dramatically increases. This causes an increase in pressure that pushes the nozzle against the strain gauge. The signal from the strain gauge is used by the system in the refill calibration process. The signal from the strain gauge is monitored by the dot generator controller 40. This signal is integrated over time and compared with a target. If the target is larger than the integrated signal, then the time the air pressure is applied to the reservoir is increased a fixed amount. If the target is smaller than the integrated signal, then it is decreased by the same fixed amount. This cycle is repeated a number of times to give the system a chance to stabilize. The air pressure ON time over a series of successive shots, for example twelve shots, is averaged and is used as the air ON time most likely to produce a correct refill sequence.

The presence of an air bubble in the viscous material inside the dot generation chamber will adversely impact the operation of the dot generator. Both the volume and shape of an ejected dot can be effected by the presence of an air bubble. Ultimately if a bubble is large enough, the dot generator 12 may miss dispensing dots altogether. The computer 18 and dot generator controller 40 process the strain gauge signals produced during refill calibration in order to detect air bubbles inside the syringe or nozzle assembly. The dot generator controller 40 digitizes and stores the strain gauge signals in a buffer long enough for the computer 18 to analyze and determine whether or not a bubble is present. A bubble acts as a damper on the strain gauge signal, delaying it in time and changing its shape to a lower amplitude and extending its duration. The computer 18 queries the dot generator controller 40 and determines whether a bubble is present by comparing portions of the digitized strain gauge signal to predetermined stored levels and locations at predetermined times. If the computer 18 determines the presence of a bubble, it will command the dot generator controller 40 to purge some of the viscous material into a vacuum cup at the service station 46.

Figure 3:
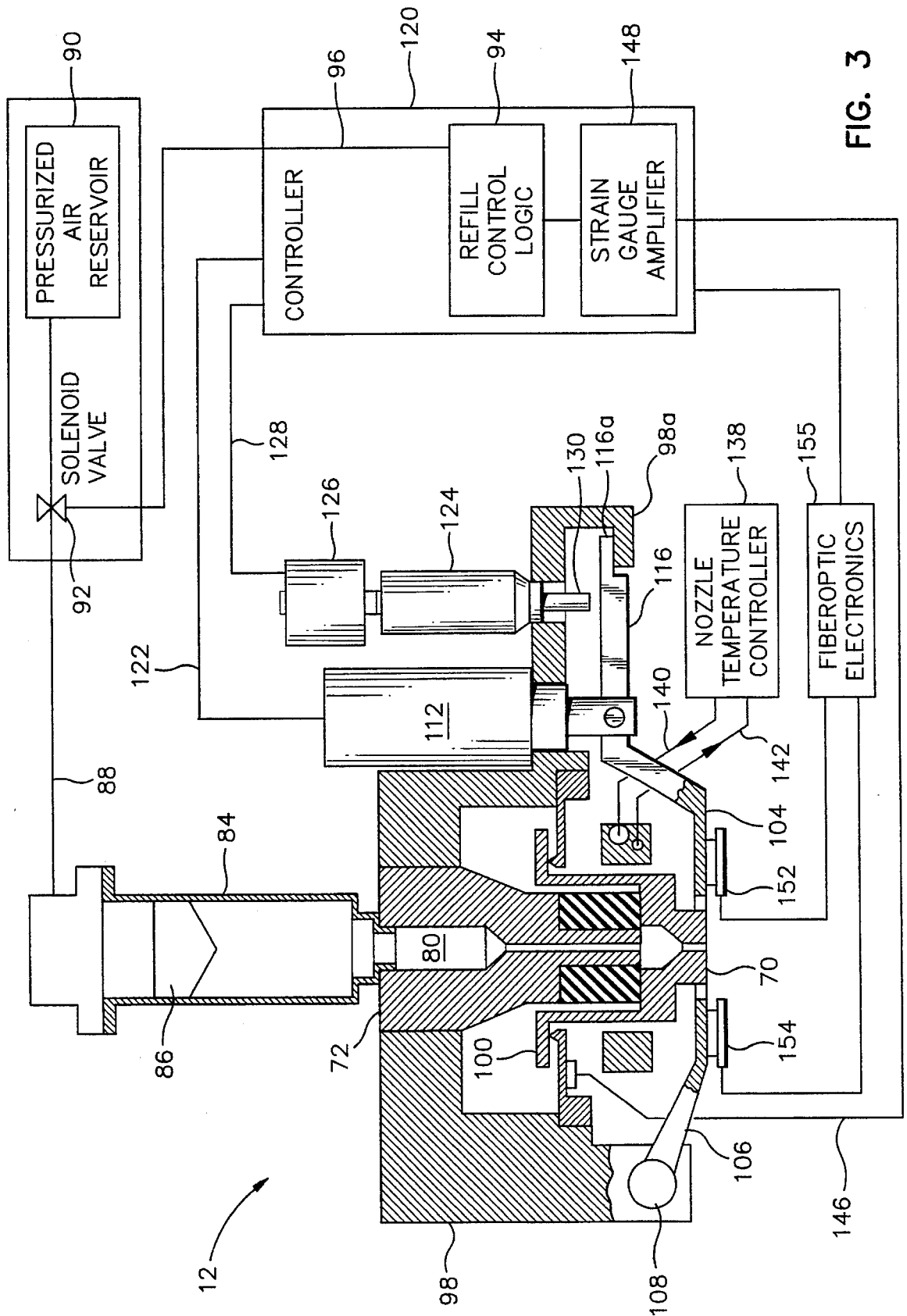
FIG. 3 is a part vertical sectional view and part diagrammatic view of a viscous material dot generator that may be used in the preferred embodiment of our system.
Figure 4:
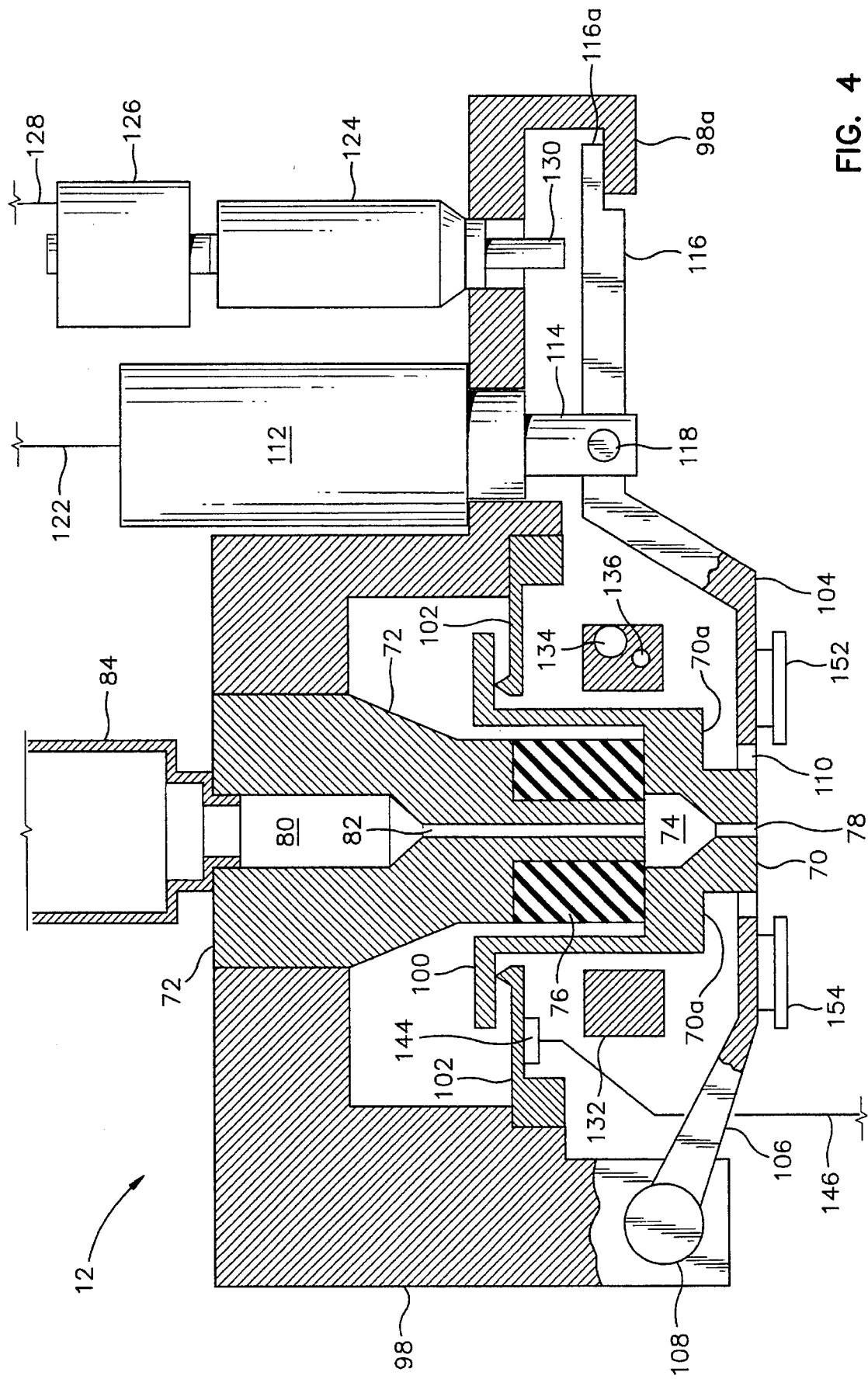
FIG. 4 is enlarged view of the fluid feed conduit, nozzle, impact hammer, and adjacent structure of the dot generator of FIG. 3.

FIGS. 3 and 4 illustrate preferred form of the viscous material dot generator 12 that may be used in the preferred embodiment of our system. A nozzle 70 is rapidly retracted upwardly relative to a fluid feed conduit 72 in order to eject very small droplets or blobs of viscous material at a high velocity from a drop generation chamber 74 inside the nozzle. The nozzle 70 and the fluid feed conduit 72 are both generally cylindrical. The inner diameter of the drop generation chamber 74 is slightly larger then the outer diameter of the fluid feed conduit 72 so that the former can reciprocate relative to the latter. An elastometric cylindrical sealing gasket 76 which surrounds the lower portion of the fluid feed conduit 72 forms a seal between conduit 72 and nozzle 70, while allowing relative reciprocating motion between them. Upward reciprocation of nozzle 70 relative to the lower portion of the fluid feed conduit 72 forces the lower end of the feed conduit 72 into the drop generation chamber 74. The lower end of the fluid feed conduit 72 thus acts as a plunger or generation chamber 74. This forces a minute quantity of viscous fluid from the drop generation chamber 74 through an exit orifice 78 at a high velocity.

The enlarged upper portion of the fluid feed conduit 72 has a chamber 80 which communicates with the drop generation chamber 74 through a narrow feed passage 82. A conventional dispensing syringe 84 has its lower end screwed into the enlarged upper end of the feed conduit 72 so that the interior of the syringe communicates with the chamber 80. A plunger 86 within the syringe 84 is driven by air delivered via line 88 from a pressurized air reservoir 90. Pressurized air is selectively metered to the syringe 84 via actuation of a solenoid valve 92 connected to a refill control logic circuit 94 via line 96.

The enlarged upper end of the fluid feed conduit 72 is mounted in a hole formed in a frame member 98. The nozzle 70 has an upper radial flange 100. The underside of the flange 100 is normally supported by a plurality of cantilever beams 102. The enlarged outer ends of these beams 102 are connected to the frame member 98. The inner ends of the cantilever beams 102 have upwardly directed triangular shaped projections, the apexes of which contact the underside of the flange 100. An impact hammer 104 has a first end 106 pivotally mounted to the frame member 98 by a pivot assembly 108. The impact hammer 104 has a hole 110 through which the lower end of the nozzle 70 projects.

A solenoid 112 is mounted in a hole in the frame member 98 so that its rod 114 can be connected to a second end 116 of the impact hammer 104 via pin 118. The solenoid 112 is connected to a controller circuit 120 via line 122. The controller 120 can energize the solenoid 112 to pull its rod 114 upwardly. This pivots the impact hammer 104 upwardly in an amount sufficient so that the portions of the hammer surrounding the hole 110 impact the shoulder 70a of the nozzle. This in turn causes the nozzle to suddenly move upward a slight amount, compressing the elastomeric sealing gasket 76.

The distal end 116a of the impact hammer rests on a ledge 98a of the frame member when the solenoid 112 is de-energized to permit the impact hammer to swing downwardly under gravitational force and the restoring force of the sealing gasket 76 and the return spring in the solenoid.

A stroke adjustment micrometer screw assembly 124 is mounted in another hole in the frame member 98 adjacent the solenoid 112. The micrometer screw assembly 124 is driven by a stroke adjustment motor 126. The stroke adjustment motor is also driven by the controller circuit 120 via line 128. The controller circuit 120 can energize the motor 126 to drive the micrometer screw assembly 124 to extend or retract its stop rod 130. This provides an adjustable upper limit for the movement of the impact hammer 104.

The nozzle 70 is in contact with a surrounding heater ring 132. A heating resistor 134 and a thermocouple or thermistor 136 are mounted in holes in the heating ring 132. The resistor 134 and thermistor 136 are connected to a nozzle temperature controller circuit 138 via lines 140 and 142. The nozzle temperature controller circuit 138 precisely regulates the temperature of the nozzle 70 to achieve a predetermine viscosity of the fluid contained within the drop generation chamber 74. This is accomplished by sending the desired amount of current to the heating resistor 134 utilizing feedback control based upon the output signals from the thermocouple 136. Precise regulation of the temperature of the viscous fluid within the drop generation chamber 74 is extremely critical to high speed uniform ejection of droplets of the viscous material.

A strain gauge 144 is connected via line 146 to a strain gauge amplifier 148 which also forms part of the controller circuit 120. When the nozzle 70 descends under both gravitational force and the expansion force of the sealing gasket 76, its radial flange 100 strikes the cantilever beams 102. This causes the strain gauge 144 to generate a signal which is amplified by the strain gauge amplifier 148 and sent to the refill control logic 94. The refill control logic in turn shuts off the pressurized air from the reservoir 90 through line 88 into the syringe 84.

The dot generator 12 also includes a drop detector in the form of a fiber optic emitter 152 and a detector 154. These components are mounted to the underside of the impact hammer 104 so that the beam from the emitter 152 traverses the hole 110 and is received by the detector 154. The emitter and detector are positioned so that the beam from the emitter is aligned with the exit orifice 78 in the nozzle 70. The emitter and the detector are connected via leads (not illustrated) to the controller 120. Each time a blob or droplet of viscous material is ejected from the nozzle 70, it intercepts the beam from the emitter 152. The detector 154 then sends a signal to the controller 120 via a fiberoptic electronics circuit 155.

While we have described a preferred embodiment of our computer controlled system for high speed surface mount adhesive placement in circuit board production, it will be understood by those skilled in the art that our invention may be modified in both arrangement and detail. For example other types of generally planar workpieces besides circuit boards may be handled by our system. Other types of viscous fluid may be rapidly dispensed, such as solder paste, potting compound and encapsulant. Therefore, the protection afforded our invention should only be limited in accordance with the scope of the following claims.

We claim:

1. A viscous fluid dispensing system, comprising:

a frame;

conveyor means mounted on the frame for horizontally transporting a planar workpiece;

an X-Y positioner mounted to the frame above the conveyor means and defining an X axis of movement and a Y axis of no movement;

viscous fluid dot generator means mounted to the X-Y positioner for rapidly ejecting jets of viscous fluid to form dots on an upper surface of the workpiece without wetting the surface;

dot generator controller means connected to the dot generator means for varying the size of the dots formed on the workpiece surface; and a priming station for drawing viscous fluid through the dot generator means.

2. A viscous fluid dispensing system, comprising:

a frame;

conveyor means mounted on the frame for horizontally transporting a planar workpiece;

an X-Y positioner mounted to the frame above the conveyor means and defining an X axis of movement and a Y axis of movement;

viscous fluid dot generator means mounted to the X-Y positioner for rapidly ejecting jets of viscous fluid to form dots on an upper surface of the workpiece without wetting the surface; and dot generator controller means connected to the dot generator means for varying the size of the dots formed on the workpiece surface;

wherein the dot generator means includes a nozzle that reciprocates relative to a feed tube, hammer means for striking the nozzle to eject the jets of viscous fluid and solenoid means for driving the hammer means; and wherein the dot generator controller means includes means for providing a predetermined electrical signal to the solenoid means to generate a predetermined impact energy when the hammer means strikes the nozzle to thereby cause a dot of a predetermined size to be generated.

3. A viscous fluid dispensing system, comprising:

a frame:

conveyor means mounted on the frame for horizontally transporting a planar workpiece;

an X-Y positioner mounted to the frame above the conveyor means and defining an X axis of movement and a Y axis of movement;

viscous fluid dot generator means including a nozzle mounted to the X-Y positioner for rapidly ejecting jets of viscous fluid to form clots on an Upper surface of the workpiece without wetting the surface;

dot generator controller means connected to the dot generator means for varying the size of the dots formed on the workpiece surface; and a computer connected to the dot generator controller means and the X-Y positioner for causing, dots to be formed at preprogrammed locations on the upper surface of the workpiece;

wherein the computer includes means for calculating a pre-launch time and for causing the dot generator controller means to eject a jet of viscous fluid while the dot generator means is moving along the X axis or the Y axis a predetermined time interval before said nozzle of the dot generator means is over one of the preprogrammed locations so that a predetermined dot will be formed on the preprogrammed location.

4. A viscous fluid dispensing system, comprising:

a frame;

conveyor means mounted on the frame for horizontally transporting a planar workpiece;

an X-Y positioner mounted to the frame above the conveyor means and defining an X axis of movement and a Y axis of movement;

viscous fluid dot generator means mounted to the X-Y positioner for rapidly ejecting jets of viscous fluid to form dots on an upper surface of the workpiece without wetting the surface;

dot generator controller means connected to the dot generator means for varying the size of the dots formed on the workpiece surface;

a computer connected to the dot generator controller means and the X-Y positioner for causing dots to be formed at preprogrammed locations on the upper surface of the workpiece;

wherein the computer includes means for calculating an optimum straight line path of movement of the dot generator means so that a subset of a plurality of dots to be formed on the upper surface of the workpiece can be formed in a single pass of the dot generator means along the optimum straight line path.

5. A viscous fluid dispensing system, comprising:

a frame;

a conveyor mounted on the frame for horizontally transporting a planar workpiece;

an X-Y positioner mounted to the frame above the conveyor;

a viscous fluid dot generator mounted to the X-Y positioner for rapidly ejecting jets of viscous fluid to form dots on an upper surface of the workpiece without wetting the surface;

a dot generator controller connected to the dot generator for varying the size of the dots formed on the workpiece surface; and a priming station for drawing viscous fluid through the dot generator.

6. A viscous fluid dispensing system, comprising:

a frame;

a conveyor mounted on the frame for horizontally transporting a planar workpiece;

an X-Y positioner mounted to the frame above the conveyor;

a viscous fluid dot generator mounted to the X-Y positioner for rapidly ejecting jets of viscous fluid to form dots on an upper surface of the workpiece without wetting the surface, said dot generator including a nozzle that reciprocates relative to a feed tube, a hammer for striking the nozzle to eject the jets of viscous fluid, and a solenoid for driving the hammer; and a dot generator controller connected to the dot generator for varying the size of the dots formed on the workpiece surface, said dot generator controller including means for providing a predetermined electrical signal to the solenoid to generate a predetermined impact energy when the hammer strikes the nozzle to thereby cause a dot of a predetermined size to be generated.

7. A viscous fluid dispensing system, comprising:

a frame;

a conveyor mounted on the frame for horizontally transporting a planar workpiece;

an X-Y positioner movable along an X axis and a Y axis mounted to the frame above the conveyor;

a viscous fluid dot generator including a nozzle mounted to the X-Y positioner for rapidly ejecting jets of viscous fluid to form dots on an upper surface of the workpiece without wetting the surface; and a dot generator controller connected to the dot generator for varying the size of the dots formed on the workpiece surface; and a computer connected to the dot generator controller and the X-Y positioner for causing dots to be formed at preprogrammed locations on the upper surface of the workpiece, said computer including means for calculating a pre-launch time and for causing the clot generator controller to eject a jet of viscous fluid while the dot generator is moving along the X axis or the Y axis a predetermined time interval before said nozzle of the dot generator is over one of the preprogrammed locations so that a predetermined dot will be formed on the preprogrammed location.

8. A viscous fluid dispensing system, comprising:

a frame;

a conveyor mounted on the frame for horizontally transporting a planar workpiece;

an X-Y positioner mounted to the frame above the conveyor;

a viscous fluid dot generator mounted to the X-Y positioner for rapidly ejecting jets of viscous fluid to form dots on an upper surface of the workpiece without wetting the surface; and a dot generator controller connected to the dot generator for varying the size of the dots formed on the workpiece surface;

a computer connected to the dot generator controller and the X-Y positioner for causing dots to be formed at preprogrammed locations on the upper surface of the workpiece, said computer including means for calculating an optimum straight line path of movement of the dot generator so that a subset of a plurality of dots to be formed on the upper surface of the workpiece can be formed in a single pass of the dot generator along the optimum straight line path.

* * * * *